(12) United States Patent
Wang et al.

(10) Patent No.: US 7,674,670 B2
(45) Date of Patent: Mar. 9, 2010

(54) METHODS OF FORMING THRESHOLD VOLTAGE IMPLANT REGIONS

(75) Inventors: Hongmei Wang, Boise, ID (US); Kurt D. Beigel, Boise, ID (US); Fred D. Fishburn, Boise, ID (US); Rongsheng Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 11/406,893

(22) Filed: Apr. 18, 2006

(65) Prior Publication Data

US 2006/0199341 A1   Sep. 7, 2006

Related U.S. Application Data

(62) Division of application No. 10/925,736, filed on Aug. 24, 2004, now Pat. No. 7,442,600.

(51) Int. Cl.
   *H01L 21/8238* (2006.01)
(52) U.S. Cl. .................. 438/217; 438/142; 438/199; 438/289; 257/E21.466
(58) Field of Classification Search ................ 438/174, 438/142, 157, 162, 199, 217, 276, 289
   See application file for complete search history.

(56) References Cited

U.S. PATENT DOCUMENTS

| | | | |
|---|---|---|---|
| 3,912,546 A | 10/1975 | Hunsperger et al. | |
| 4,250,406 A * | 2/1981 | Alaspa | 326/98 |
| 4,264,857 A | 4/1981 | Jambotkar | |
| 5,307,312 A | 4/1994 | Maurelli et al. | |
| 5,618,743 A | 4/1997 | Williams et al. | |
| 5,716,866 A | 2/1998 | Dow et al. | |
| 5,912,509 A | 6/1999 | Kasai et al. | |
| 6,027,978 A | 2/2000 | Gardner et al. | 438/289 |
| 6,063,659 A | 5/2000 | Le | |
| 6,121,086 A * | 9/2000 | Kuroda et al. | 438/256 |
| 6,429,087 B2 | 8/2002 | Kwok et al. | 438/381 |
| 2002/0117720 A1 | 8/2002 | Lee et al. | |

OTHER PUBLICATIONS

Douglas, Edward C. & Dingwall; "Ion Implantation for Threshold Control in COSMOS Circuits" IEEE Transaction on Election Devices, vol. ED-21, , No. 6, Jun. 1974.

* cited by examiner

*Primary Examiner*—Matthew C Landau
*Assistant Examiner*—Candice Y Chan
(74) *Attorney, Agent, or Firm*—Wells St. John, P.S.

(57) ABSTRACT

The invention includes methods of forming channel region implants for two transistor devices simultaneously, in which a mask is utilized to block a larger percentage of a channel region location of one of the devices relative to the other. The invention also pertains to methods of forming capacitor structures in which a first capacitor electrode is spaced from a semiconductor substrate by a dielectric material, a second capacitor electrode comprises a conductively-doped diffusion region within the semiconductor material, and a capacitor channel region location is beneath the dielectric material and adjacent the conductively-doped diffusion region. An implant mask is formed to cover only a first portion of the capacitor channel region location and to leave a second portion of the capacitor channel region location uncovered. While the implant mask is in place, dopant is implanted into the uncovered second portion of the capacitor channel region location.

18 Claims, 12 Drawing Sheets

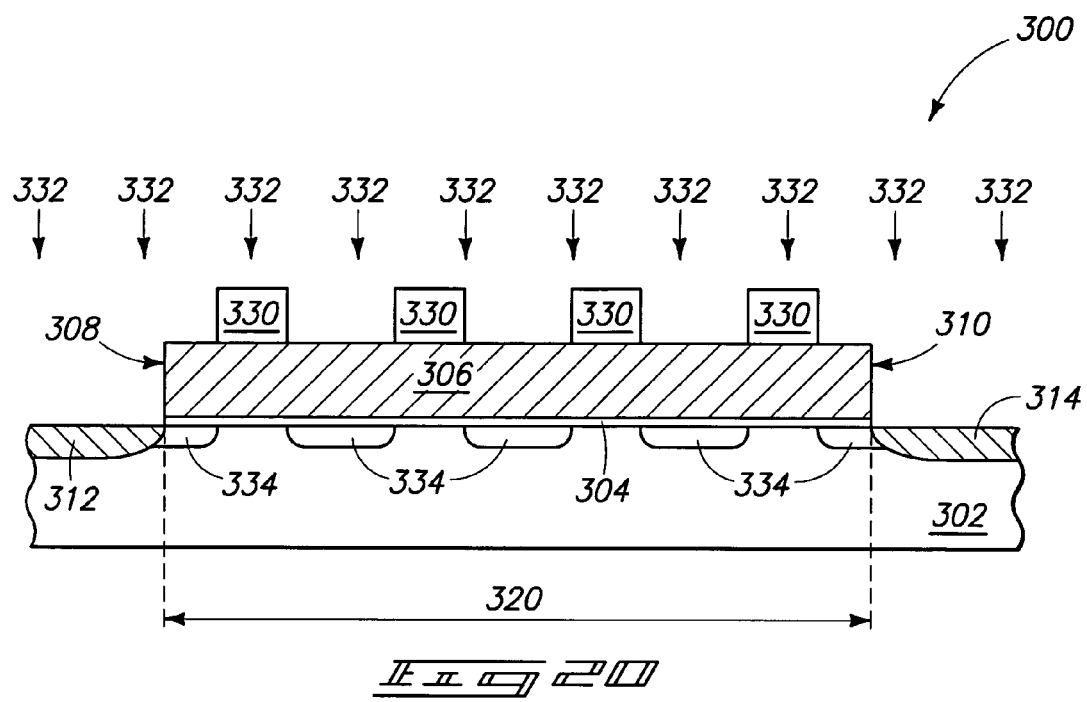
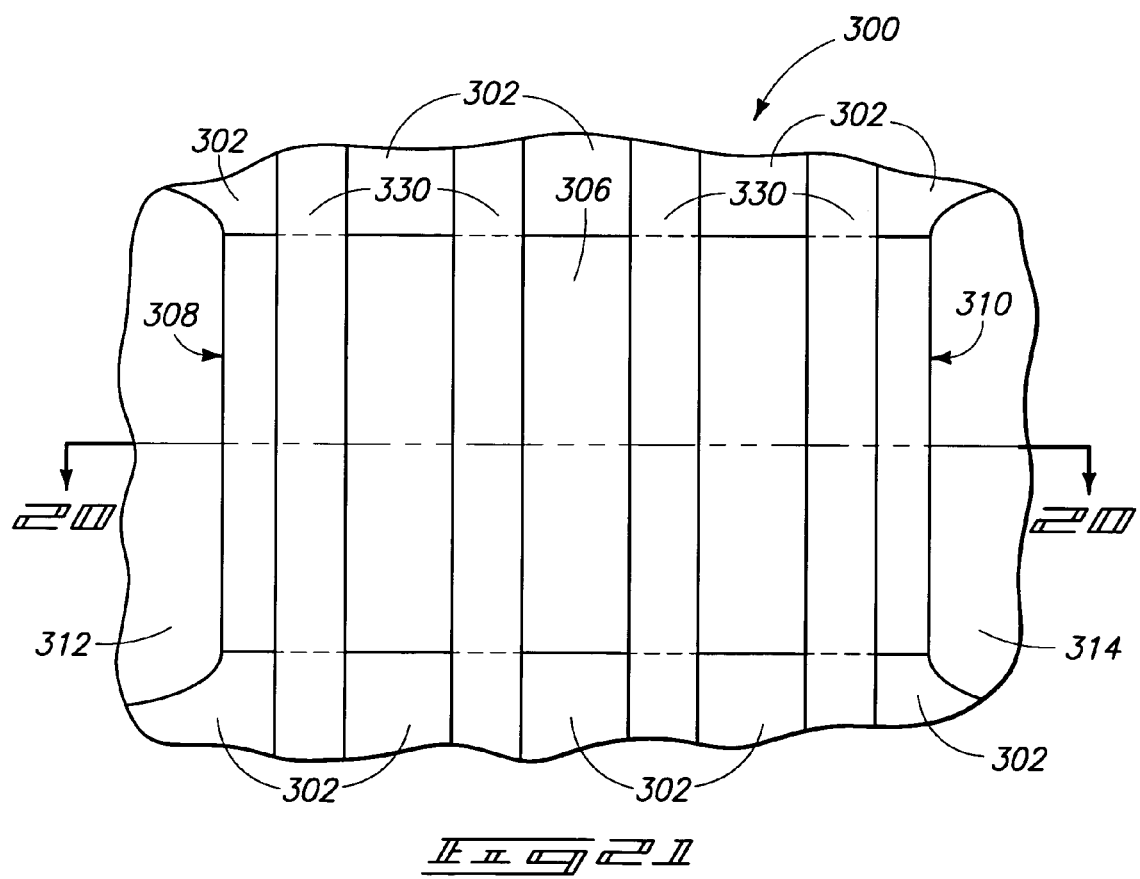

US 7,674,670 B2

METHODS OF FORMING THRESHOLD VOLTAGE IMPLANT REGIONS

RELATED PATENT DATA

This patent resulted from a divisional of U.S. patent application Ser. No. 10/925,736, filed Aug. 24, 2004, now U.S. Pat. No. 7,442,600 which is hereby incorporated by reference.

TECHNICAL FIELD

The invention pertains to methods of forming capacitor structures, methods of forming threshold voltage implants, and methods of forming channel region implants.

BACKGROUND OF THE INVENTION

Field effect transistors (FETS) are common devices of integrated circuitry. One method of tailoring the properties of an FET is to adjust the dopant level within a channel region device, which can adjust a threshold voltage of the device. Dopants provided within the channel regions of FETs are frequently referred to as threshold voltage implants, due to the effect that such dopants can have on threshold voltage.

FIG. 1 shows a construction 10 comprising an exemplary prior art FET 12. The FET is supported by a semiconductor substrate 14. Substrate 14 can comprise any suitable semiconductor material, and in particular aspects can comprise, consist essentially of or consist of monocrystalline silicon lightly background-doped with p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 14 can be part of a monocrystalline silicon wafer, and accordingly can correspond to so-called bulk silicon. In other aspects of the prior art, substrate 14 can correspond to a thin layer of semiconductive material which is formed over a layer of insulative material (not shown), and accordingly can be part of a silicon-on-insulator (SOI) construction.

Transistor device 12 comprises a pair of source/drain regions 16 and 18 extending within the semiconductor substrate 14. Source/drain regions 16 and 18 correspond to conductively-doped diffusion regions, and can comprise one or both of n-type dopant and p-type dopant.

Transistor device 12 also includes electrically conductive gateline material 20 over substrate 14 and between the regions 16 and 18. Gateline material 20 forms a gate 13 of the transistor device, and can comprise any suitable conductive material or combination of conductive materials. In particular aspects, gateline material 20 can comprise one or more electrically conductive materials selected from the group consisting of metals, metal compounds, and conductively-doped silicon. Gateline material 20 can be a portion of a wordline which extends in a direction orthogonal to the surface of the page of FIG. 1.

Although the gateline material 20 is shown to comprise electrically conductive material throughout the entire thickness, it is to be understood that the gateline material 20 would typically be capped by an electrically insulative material, such as, for example, a material comprising one or both of silicon dioxide and silicon nitride (not shown).

A pair of electrically insulative sidewall spacers 22 and 24 extend along opposing sidewalls of gate 13. Spacers 22 and 24 can comprise any suitable electrically insulative material, and in particular aspects can comprise one or both of silicon dioxide and silicon nitride.

Gateline material 20 is separated from semiconductor material 14 by a dielectric material 26. Dielectric material 26 can comprise any suitable material or combination of materials, and in particular aspects will comprise, consist essentially of, or consist of silicon dioxide.

Transistor device 12 comprises a channel region 28 beneath the gate 13, and between source/drain regions 16 and 18. In operation, gate 13 is utilized to turn on electrical flow within the channel region 28, and to thereby electrically connect source/drain regions 16 and 18 with one another. The voltage at which the gate turns on electrical flow between source/drain regions 16 and 18 is referred to as a threshold voltage, and the magnitude of such threshold voltage can be influenced by the amount and type of dopant present within channel region 28.

A continuing goal during semiconductor device fabrication is to reduce the number of process steps. Accordingly, processing steps associated with fabrication of separate devices are combined. Generally, there will be numerous FETs formed simultaneously, and some of the FETs will be fabricated differently than others during threshold voltage implanting so that the threshold voltage implants of particular devices can be tailored for specific applications of the devices. An exemplary prior art method of forming prior art FETs having different threshold voltage implants relative to one another is described with reference to FIGS. 2-5.

Referring initially to FIG. 2, a semiconductor construction 50 is illustrated at a preliminary processing stage. Construction 50 comprises the substrate 14, gate dielectric 26, and gateline material 20 described previously with respect to FIG. 1. The gateline material 20 and dielectric material 26 are not yet patterned into the gate shape at the processing stage of FIG. 2.

Construction 50 is divided amongst a first segment 52 over which a first transistor device will be formed and a second segment 54 over which a second transistor device will be formed. The first and second transistor devices will have different threshold voltage implants relative to one another. It is to be understood that the first transistor device will typically be part of a set of first devices fabricated identically relative to one another, and a second transistor device will typically be part of a set of second transistor devices which are also fabricated identically to one another.

A masking material 56 is provided over the first segment 52, and not over the second segment 54. Subsequently, a threshold voltage implant is conducted to implant dopant 60 into substrate 14. The masking material 56 prevents dopant 60 from penetrating into the substrate 14 associated with segment 52, while the unprotected segment 54 has dopant 60 penetrating therein to form a threshold voltage implant region 62 within substrate 14 (the threshold voltage implant region is demarcated with a dashed line in FIG. 2). The masking material 56 utilized to protect segment 52 can comprise any suitable material, and in particular aspects will comprise, consist essentially of or consist of photoresist. In such aspects, masking material 56 can be patterned into a desired shape utilizing photolithographic processing.

Referring next to FIG. 3, masking material 56 (FIG. 2) is stripped from over construction 50, and another masking material 63 is formed to be over segment 54 and not over segment 52. Subsequently, a dopant 64 is implanted into segment 52 to form a threshold voltage implant 66. Masking material 63 prevents dopant 64 from entering the substrate 14 of segment 54. Masking material 63 can comprise the same compositions discussed above regarding masking material 56, and accordingly, can, in particular aspects, comprise, consist essentially of or consist of photoresist.

Referring next to FIG. 4, masking material 63 (FIG. 3) is removed. Since the threshold voltage implant regions 62 and 66 are formed at different times relative one another, the implant regions can be formed to comprise different dopant concentrations relative to one another. Accordingly, the regions 62 and 66 can be specifically tailored for different transistor device applications relative to one another.

Referring next to FIG. 5, transistor constructions 70 and 72 are formed over segments 52 and 54, respectively. Transistor construction 70 comprises source/drain regions 74 and 76, a gate 78 patterned from gateline material 20 and dielectric material 26, and sidewall spacers 80 formed along sidewalls of gate 78. Transistor device 72 comprises source/drain regions 82 and 84, a gate 86 patterned from gateline material 20 and dielectric material 26, and sidewall spacers 88 formed along sidewalls of gate 86.

The channel implant regions 62 and 66 form channel regions for gates 72 and 70, respectively. Since the channel implant regions were formed at different times relative to one another and can comprise different dopant concentrations (and in some aspects different dopant types) relative to one another, the threshold voltage of transistor device 72 can be tailored to be different than that of device 70 through the type of implant utilized for region 62 relative to that utilized for region 66.

It is desired to develop new methods for forming multiple transistors which are improved relative to the methods discussed above in one or both of the number of processing steps utilized and the complexity of the processing steps utilized.

Although the invention was motivated, at least in part, by the desire to develop new methodologies for simultaneously forming differently tailored threshold voltage implants amongst a plurality of transistor devices, the invention is not limited to such applications.

SUMMARY OF THE INVENTION

In one aspect, the invention encompasses a method of forming threshold voltage implants. A semiconductor substrate is provided. The substrate has at least two channel region locations defined therein. One of the at least two channel region locations is a first channel region location and another is a second channel region location. The first and second channel region locations have first and second areas, respectively. A mask is provided to block a larger percentage of the second area than the first area. While the mask is in place, a threshold voltage implant is conducted into both the second channel region location and the first channel region location.

In one aspect, the invention pertains to a method of forming channel region implants. A semiconductor substrate is provided. The substrate has at least two channel region locations defined therein. One of the two channel region locations is a first channel region location and another is a second channel region location. A mask is provided which covers a first portion of the second channel region location while leaving a second portion of the second channel region location uncovered. The mask leaves an entirety of the first channel region location uncovered. Dopant is implanted into the uncovered second portion of the second channel region location and the uncovered first channel region location. The dopant is diffused into at least some of the first portion of the second channel region location.

In one aspect, the invention encompasses a method of forming a capacitor structure. A semiconductor material is provided. A dielectric material is formed over a portion of the semiconductor material. The dielectric material has a lateral periphery. At least some of the portion of the semiconductor material beneath the dielectric material is a capacitor channel region location. A first capacitor electrode is formed to have at least a portion over the dielectric material. At least one conductively-doped diffusion region is formed within the semiconductor material. At least a portion of the diffusion region is laterally outward of the lateral periphery of the dielectric material. The conductively-doped diffusion region is at least part of a second capacitor electrode. An implant mask is formed over a portion of the capacitor channel region location to leave another portion of the capacitor channel region location uncovered. While the implant mask is over the portion of the capacitor channel region location, dopant is implanted into the uncovered portion of the capacitor channel region location.

BRIEF DESCRIPTION OF THE DRAWINGS

Preferred embodiments of the invention are described below with reference to the following accompanying drawings.

FIGS. 20 and 21 are views of the fragments of FIGS. 18 and 19, respectively, shown at a processing stage subsequent to that of FIGS. 18 and 19. The cross-section of FIG. 20 is along the line 20-20 of FIG. 21.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

As circuit density increases, and circuit function becomes more complicated, it is becoming increasingly important to offer transistors with different threshold voltages. Prior art methods for providing different threshold voltages amongst various transistors utilize extra masks to adjust doping concentration, which increases the costs and complexity associated with the manufacture semiconductor devices. One aspect of the present invention is a method of providing different amounts of masking over channel region locations during a threshold voltage implant so that threshold voltages of different transistors are specifically tailored to the functions of the transistors. This aspect of the invention is discussed with reference to FIGS. 6-17.

Figure 1:
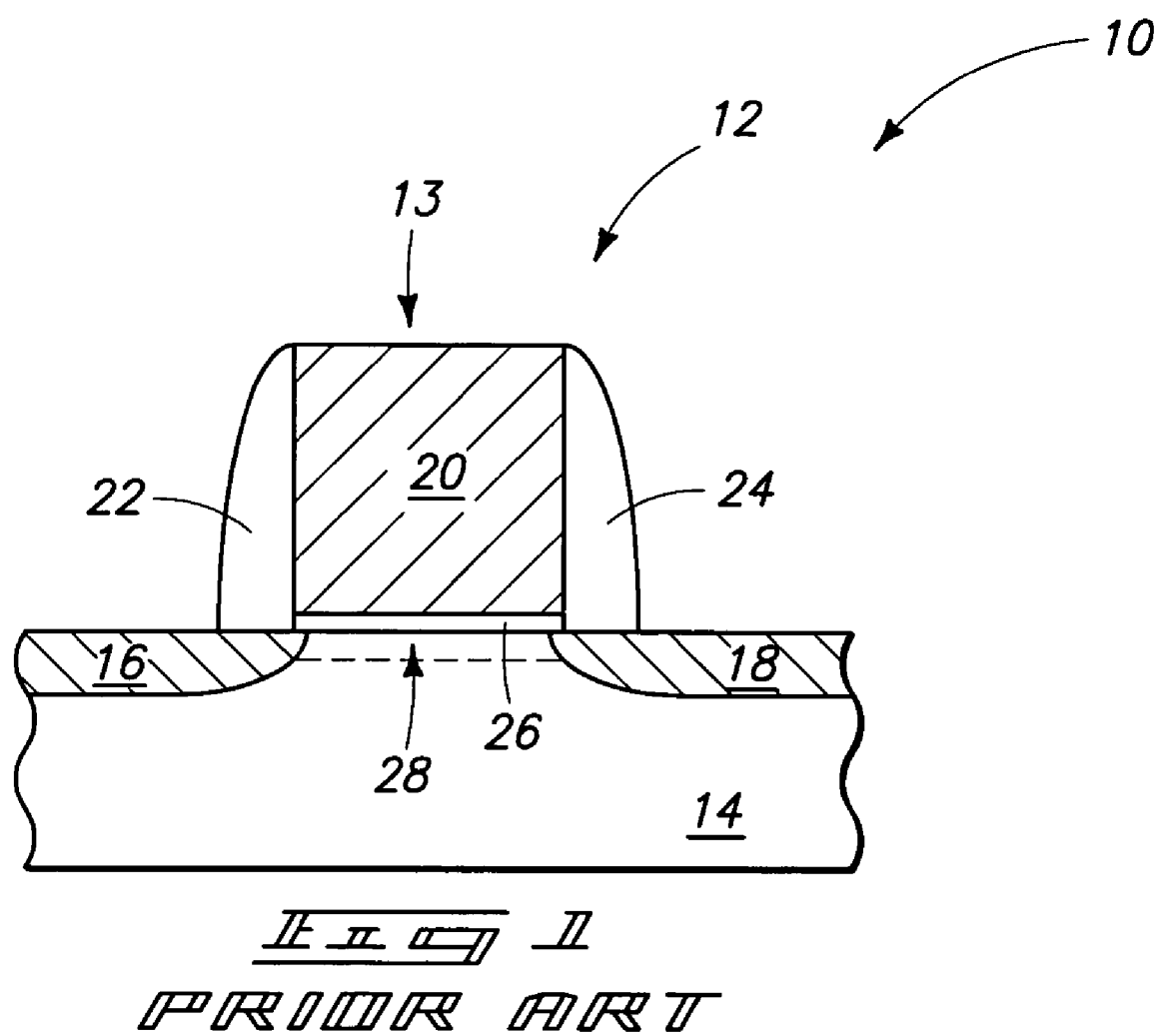
FIG. 1 is a diagrammatic, cross-sectional view of a semiconductor wafer fragment illustrating a prior art field effect transistor device.
Figure 2:
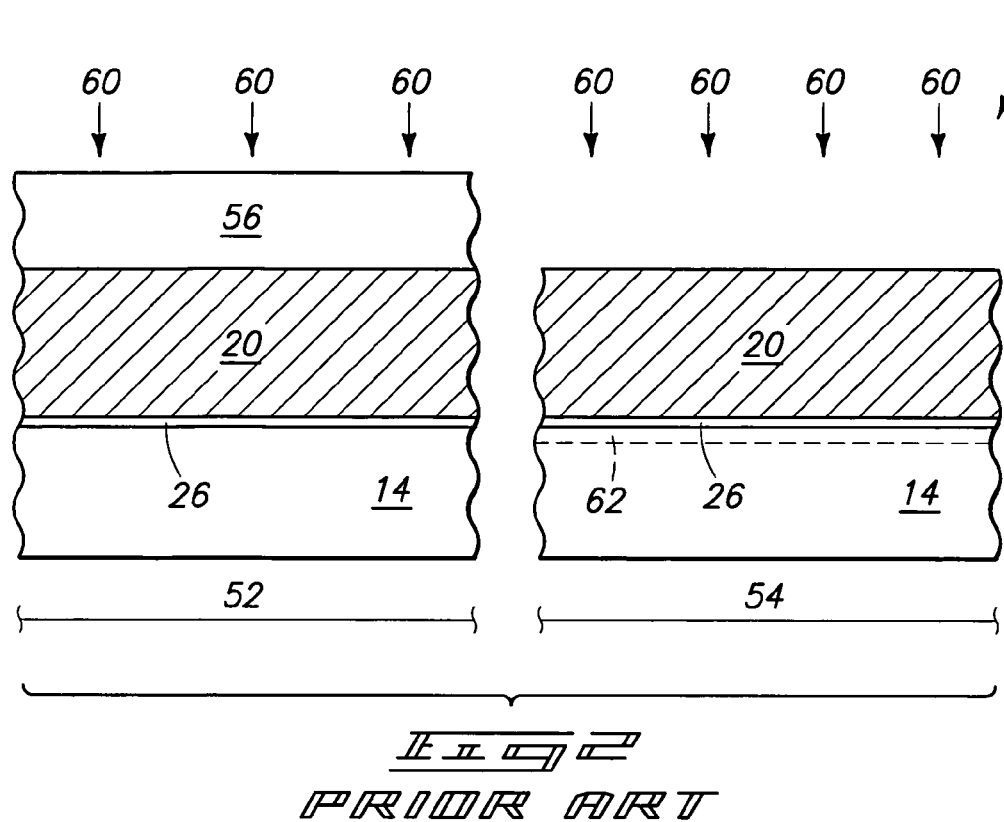
FIG. 2 is a diagrammatic, cross-sectional view of a pair of semiconductor wafer fragments at a preliminary processing stage of a prior art method for forming field effect transistor devices.
Figure 3:
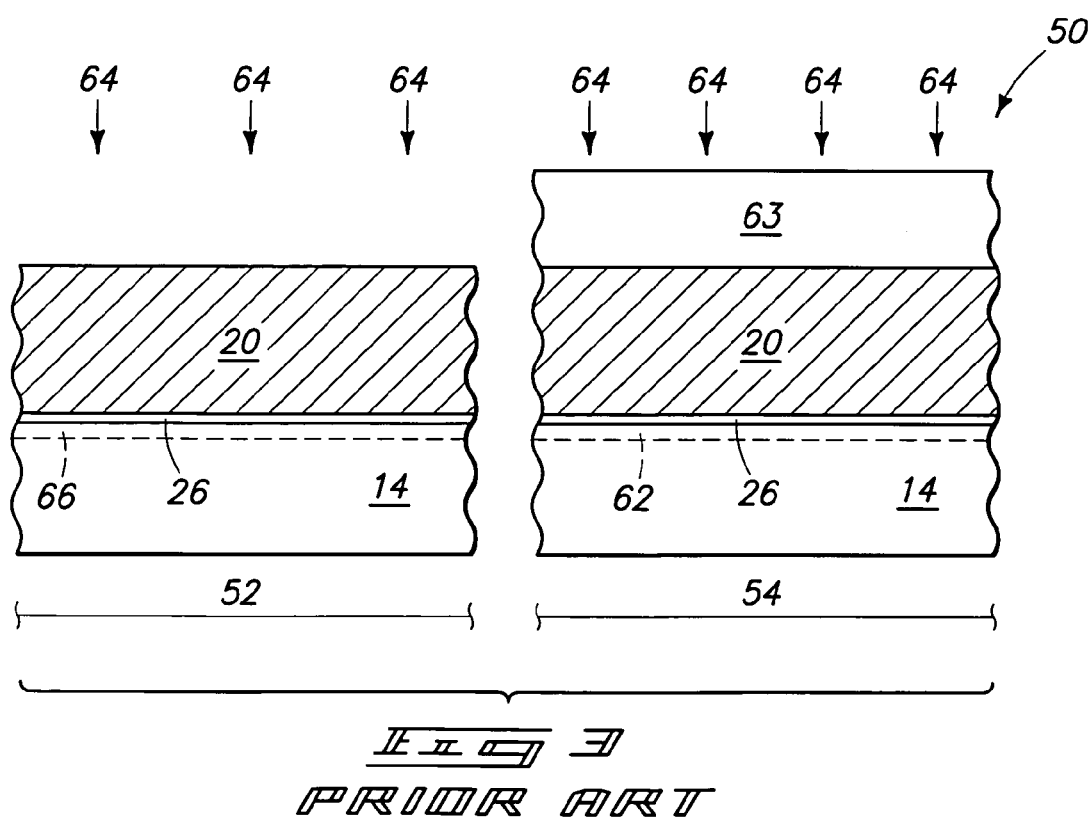
FIG. 3 is a view of the FIG. 2 wafer fragments shown at a prior art processing stage subsequent to that of FIG. 2.
Figure 4:
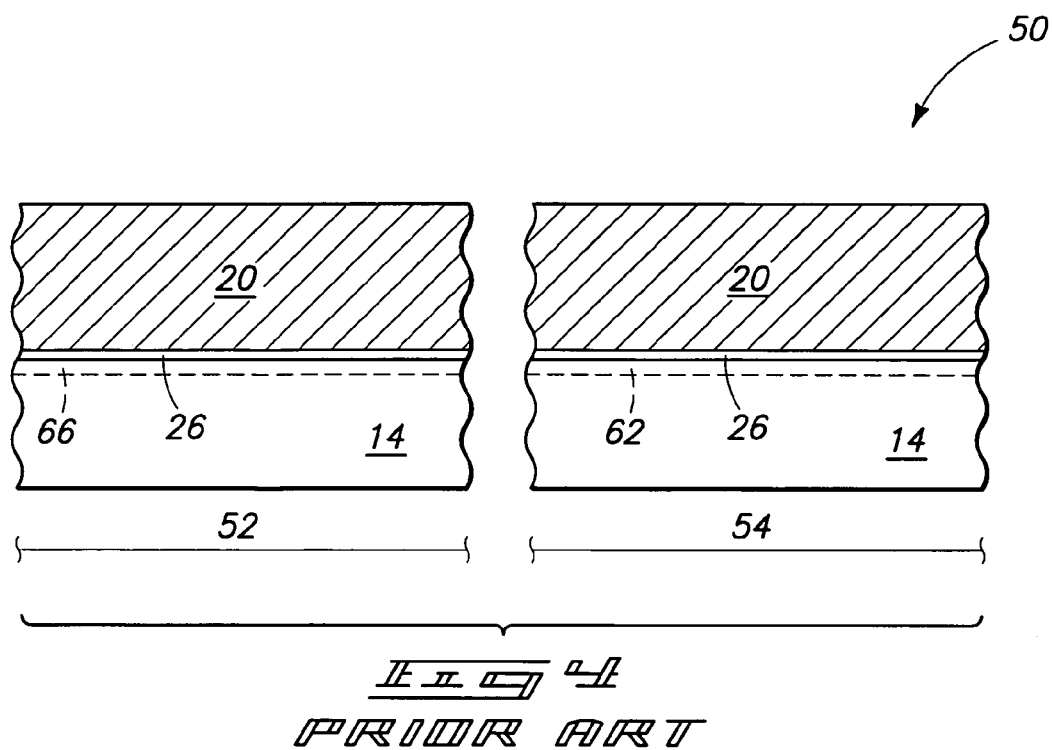
FIG. 4 is a view of the FIG. 2 wafer fragments shown at a prior art processing stage subsequent to that of FIG. 3.
Figure 5:
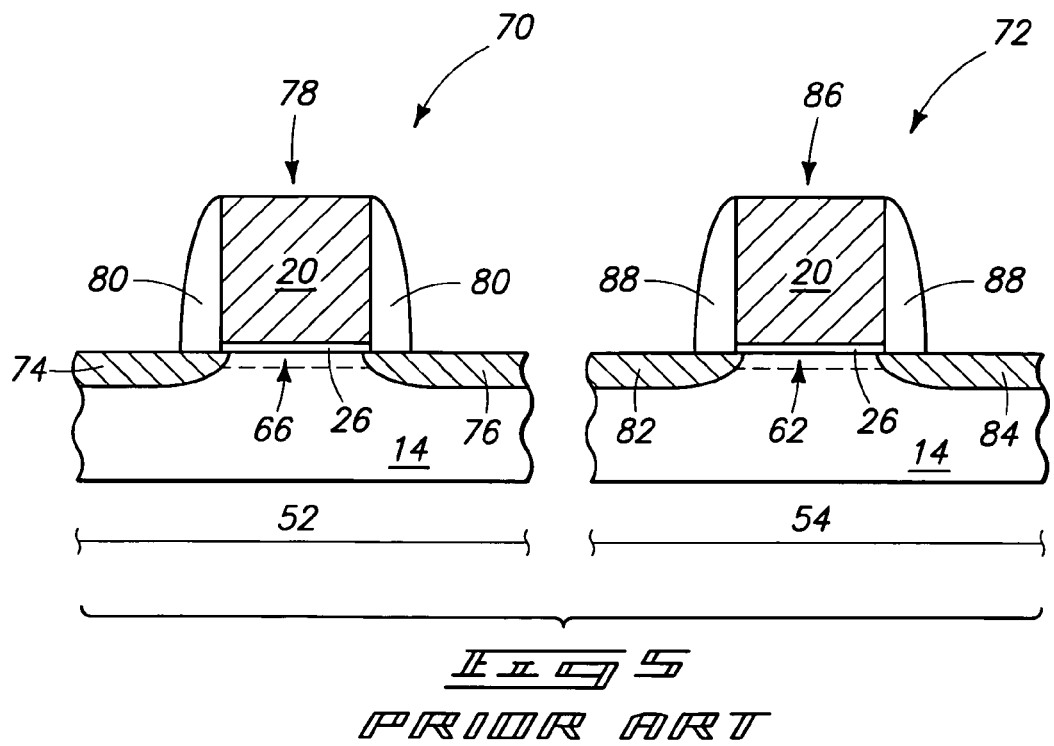
FIG. 5 is a view of the FIG. 2 wafer fragments shown at a prior art processing stage subsequent to that of FIG. 4.
Figure 6:
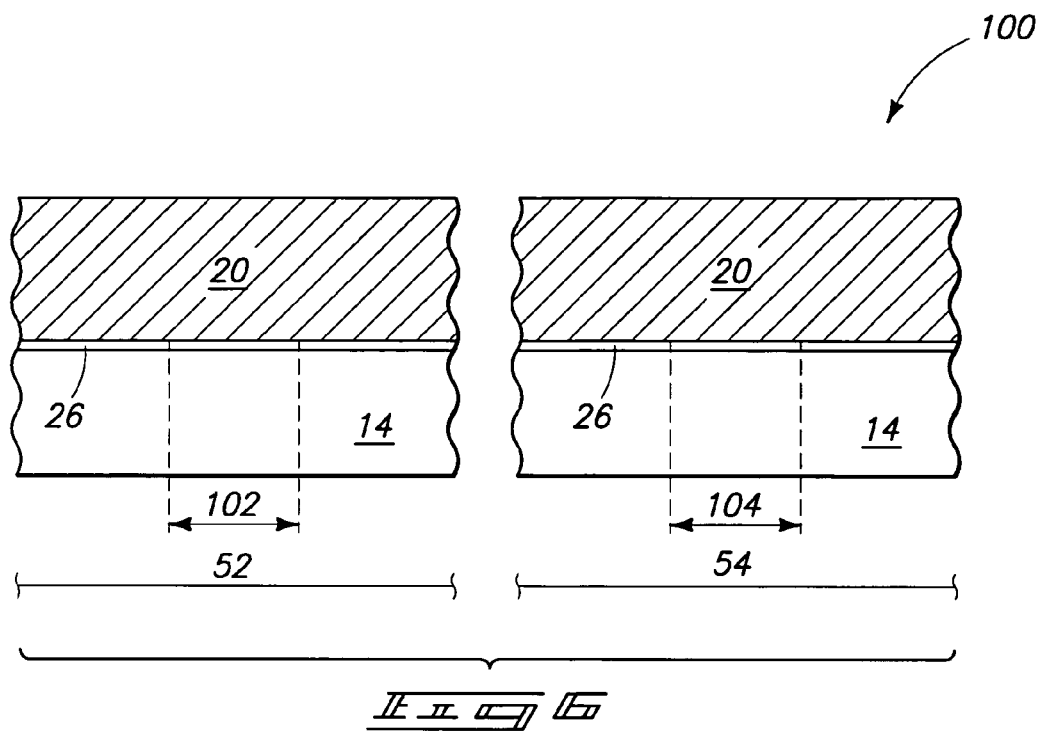
FIG. 6 is a diagrammatic, cross-sectional view of a pair of fragments of a semiconductor construction shown at a preliminary processing stage of an exemplary aspect of the present invention.

Referring initially to FIG. 6, a construction 100 is illustrated at a preliminary processing stage of an exemplary method of the present invention. Construction 100 comprises the segments 52 and 54 discussed previously with reference to the prior art in FIG. 2. Each of the segments comprises semiconductor substrate 14, dielectric material 26, and gate-line material 20. Ultimately, a first transistor is to be formed over segment 52 and a second transistor is to be formed over segment 54, with the first and second transistors differing in threshold voltage relative to one another. In some aspects, segment 52 can be referred to as a first portion of a semiconductor construction, and segment 54 can be referred to as a second portion of the semiconductor construction. The first portion 52 can be considered to have a first channel region location defined therein where a channel of a first transistor is ultimately to be formed, and the second portion 54 can be considered to have a second channel region location defined therein where a channel of a second transistor is ultimately to be formed. The first and second channel region locations are illustrated diagrammatically in FIG. 6 as locations 102 and 104, respectively.

The channel region locations 102 and 104 will have an area when viewed from above. Such is diagrammatically illustrated in FIG. 11, where the channel region locations are illustrated as having rectangular areas. It is to be understood that the channel region locations are diagrammatically illustrated in FIG. 11, and correspond to defined locations rather than to specific physically distinguishable locations at the processing stage of FIG. 11. Although the areas of the channel region locations 102 and 104 are shown to be rectangular, the areas can have any suitable shape, including, for example, circular, oval, or other curved shapes, in addition to polygonal shapes. Also, although the channel region locations 102 and 104 are shown having approximately the same shape as one another, it is to be understood that the regions can have different shapes relative one another in other aspects of the invention (not shown).

Each of the areas 102 and 104 corresponds to a location where a channel region will ultimately be formed for a final transistor construction, and accordingly corresponds only to the channel region portion of an active area of the final transistor construction, rather than including conductively-doped source/drain regions (with the term "source/drain" region including not only heavily doped source/drain regions, but also any lightly doped diffusion regions, halo regions, etc. that may be present in addition to the heavily doped source/drain regions).

Figure 7:
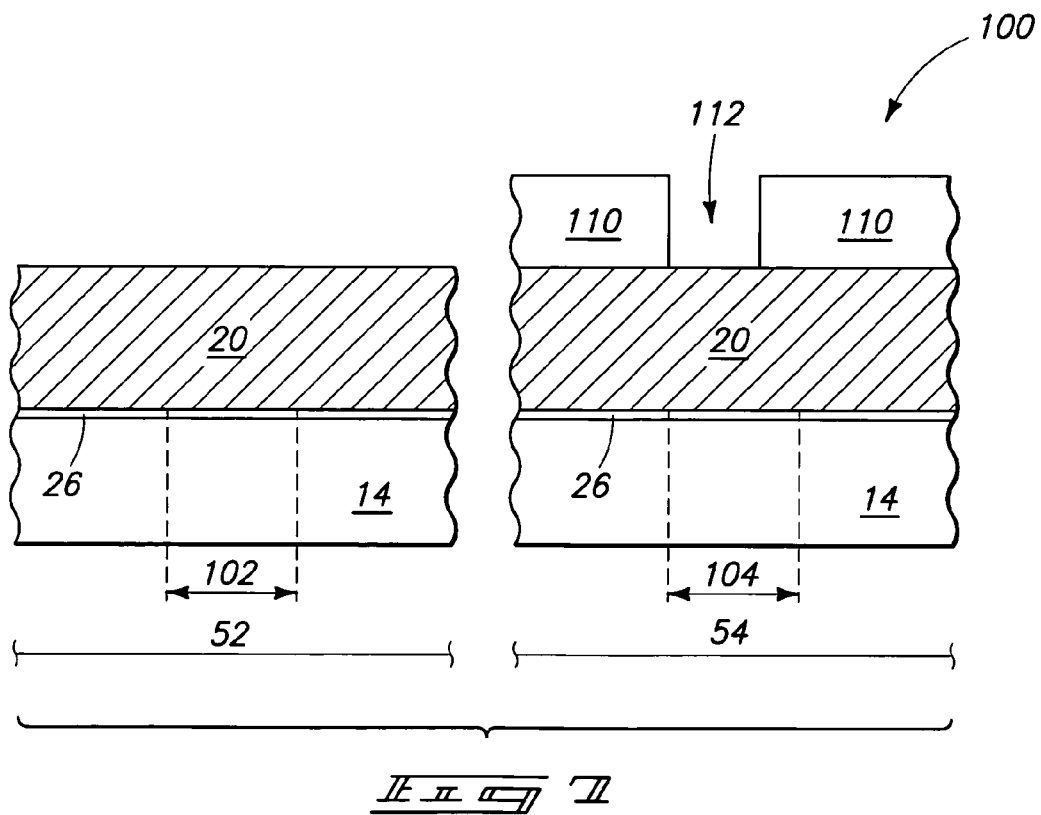
FIG. 7 is a view of the FIG. 6 wafer fragments shown at a processing stage subsequent to that of FIG. 6.

Referring to FIG. 7, a patterned mask 110 is provided over second portion 54. Mask 110 can comprise any suitable material, and in particular aspects can comprise, consist essentially of or consist of photoresist. The photoresist can be formed into the desired pattern utilizing photolithographic processing. The patterned mask has an opening 112 extending therethrough, and is formed to cover a portion of second channel region 104 while leaving another portion of the second channel region uncovered. The covered portion of the second channel region can be referred to as a first portion, and the uncovered portion of the second channel region can be referred to as a second portion.

Mask 110 can be formed to block any desired amount of the area of the first channel region location 104. In particular aspects, the mask will block at least about 25% of such area, at least about 50% of such area, or at least about 75% of such area. In some aspects, the mask can cover from about 25% of the area to about 75% of the area.

Ultimately, and as discussed below, the mask is utilized to reduce the amount of implanted dopant reaching channel region location 104 during an implant of the dopant into both channel region location 102 and channel region location 104. The implanted dopant will correspond to, for example, a threshold voltage implant, and accordingly the size of opening 112 relative to the total area of channel region location 104 can tailor the amount of dopant ultimately reaching channel region location 104. The dopant provided through opening 112 and into channel region location 104 is ultimately diffused throughout the channel region location 104 by appropriate thermal processing (as discussed below). Accordingly, the dopant per unit area formed within channel region location 104 with the implant is less than the dopant per unit area formed within the unblocked first channel region location 102. In some aspects of the invention, mask 112 can be formed to entirely block channel region location 104 while leaving sidewall edges along the channel region exposed for the dopant implant, and subsequently the dopant is diffused laterally into the channel region location 104. Accordingly, the mask 110 can, in some aspects, block about 100% of the area of channel region 104.

Although the mask 110 is not blocking any of the first channel region location 102 in the shown aspect of the invention, it is to be understood that the mask can be formed to block some of the first channel region location 102 in other aspects (not shown). In such other aspects, the mask can block a larger percentage of the area of the second channel region location 104 than of the area of the first channel region location 102 so that a subsequent implant into the first and second channel region locations provides more dopant into the first channel region location 102 than into the second channel region location 104.

Figure 8:
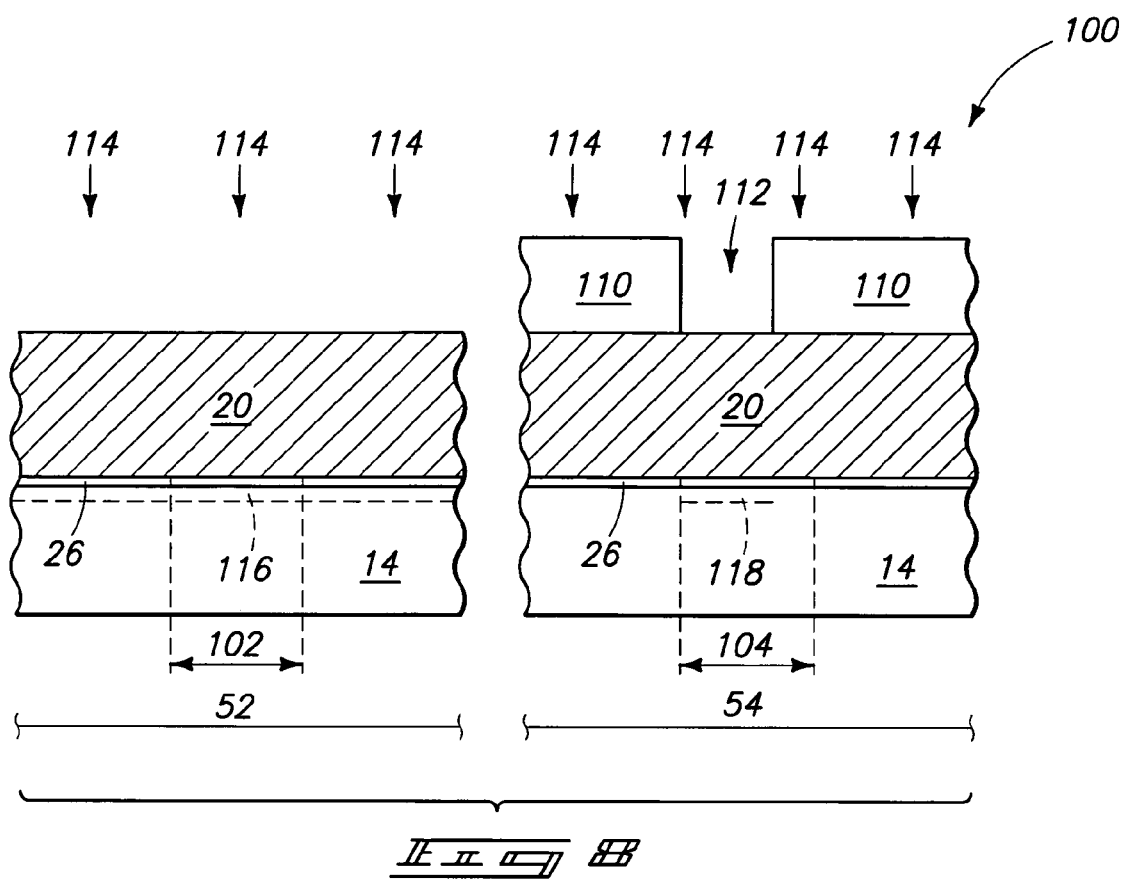
FIG. 8 is a view of the FIG. 6 wafer fragments shown at a processing stage subsequent to that of FIG. 7.

Referring to FIG. 8, dopant 114 is shown being implanted into segments 52 and 54 of construction 100 to form an implant region 116 within first channel region 102, and an implant region 118 within second channel region location 104. Since the mask 110 blocks some of the second channel region location 104, the amount of dopant implanted into the second channel region is less than the amount of dopant implanted into the first channel region 102. The implanted dopant can correspond to, for example, a threshold voltage implant. The substrate 14 can correspond to, for example, monocrystalline silicon, and accordingly the diffusion regions 116 and 118 can be conductively-doped diffusion regions extending within monocrystalline silicon material.

Figure 9:
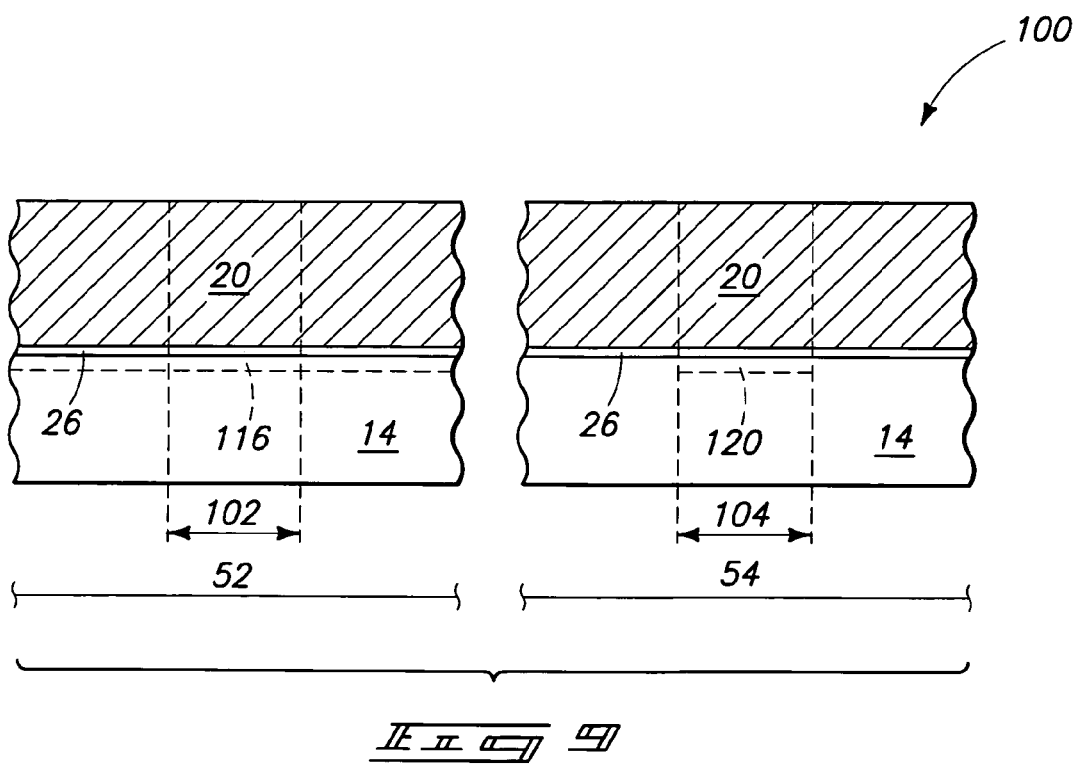
FIG. 9 is a view of the FIG. 6 wafer fragments shown at a processing stage subsequent to that of FIG. 8.

Referring next to FIG. 9, mask 110 (FIG. 8) is removed, and construction 100 is subjected to appropriate thermal processing to diffuse dopant from region 118 (FIG. 8) across a substantial entirety (and in some aspects at least an entirety) of second channel region location 104. The diffused dopant forms a doped region 120 extending across at least some of the portion of second channel region location 104 that had been covered by mask 110. The dopant can also diffuse outwardly of the channel region location 104 in some aspects (not shown).

The channel region locations 102 and 104 both contain dopant from the implant of FIG. 8. However, the concentration of dopant (i.e., the amount of dopant per unit area) within channel region location 104 is less than the concentration of dopant within channel region location 102 due to the mask 110 (FIGS. 7 and 8) blocking some of the dopant during the implant. Accordingly, the dopant levels within regions 116 and 120 can be individually tailored even though both doped regions were formed during a common implant.

Figure 10:
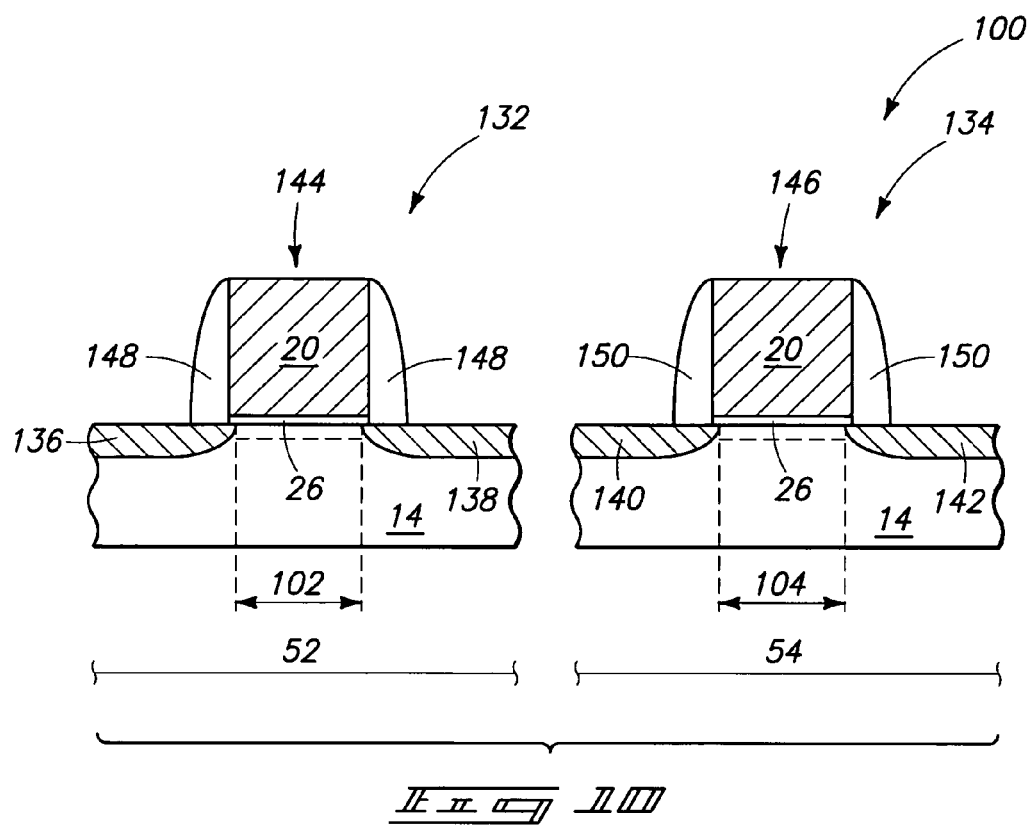
FIG. 10 is a view of the FIG. 6 wafer fragments shown at a processing stage subsequent to that of FIG. 9.

Referring next to FIG. 10, construction 100 is illustrated after channel region locations 102 and 104 are incorporated into channel regions of transistor devices 132 and 134, respectively. Transistor device 132 comprises a pair of source/drain regions 136 and 138 formed on opposing lateral sides of channel region location 102, and transistor device 134 comprises source/drain regions 140 and 142 formed on opposing lateral sides of channel region location 104. Further, transistor device 132 comprises a gateline 144 patterned from dielectric material 26 and gateline material 20, and transistor device 134 comprises a gateline 146 patterned from the materials 26 and 20. Additionally, transistor device 132 comprises a pair of sidewall spacers 148 formed on opposing sidewalls of gateline 144, and transistor device 134 comprises a pair of sidewall spacers 150 formed on the opposing sidewalls of gateline 146.

The transistor devices 132 and 134 can be identical to one another in all respects except for the amount of dopant 114 (FIG. 8) provided within the channel region locations 102 and 104. If the dopant 114 impacts threshold voltage, then the threshold voltages of devices 132 and 134 will be different from one another. Accordingly, the threshold voltages of the devices 132 and 134 can be separately and individually tailored for specific functions of the devices 132 and 134 utilizing methodology of the present invention.

Devices 132 and 134 can also differ from one another in aspects other than the amount of dopant 114 provided within the locations 102 and 104 in some embodiments of the invention. For instance, the source/drain regions 136 and 138 can be differently doped than the source/drain regions 140 and 142. Such difference can be either through the amount of doping or the type of dopant within the regions. Also, substrate 14 can have a different type of background doping in segment 52 than in segment 54. For instance, device 132 may correspond to a PMOS (p-type metal oxide semiconductor) device such that source/drain regions 136 and 138 are primarily p-type doped, and substrate 14 is primarily background n-type doped; and device 134 can correspond to an NMOS (n-type metal oxide semiconductor) device such that source/drain regions 140 and 142 are primarily n-type doped and substrate 14 is primarily p-type background doped. Alternatively, device 134 can correspond to a PMOS device and device 132 can correspond to an NMOS device.

In aspects in which the transistor devices 132 and 134 differ in type relative to one another (i.e., in which one of the devices is a PMOS device and the other is an NMOS device), the gateline material 20 of one of the transistor devices can be different than the gateline material 20 of the other device.

Although the invention is described in FIGS. 6-10 as having the gateline material 20 and dielectric material 26 both provided over substrate 14 prior to the formation of masking material 110 and the implant of dopant 114, it is to be understood that the invention encompasses other aspects (not shown) in which the formation of masking material 110 and the implant occur before provision of one or both of dielectric material 26 and gateline material 20. For instance, the masking material 110 can be formed directly over a surface of substrate 14 and the implant can occur prior to the provision of the materials 26 and 20 in some embodiments of the invention.

Figure 12:
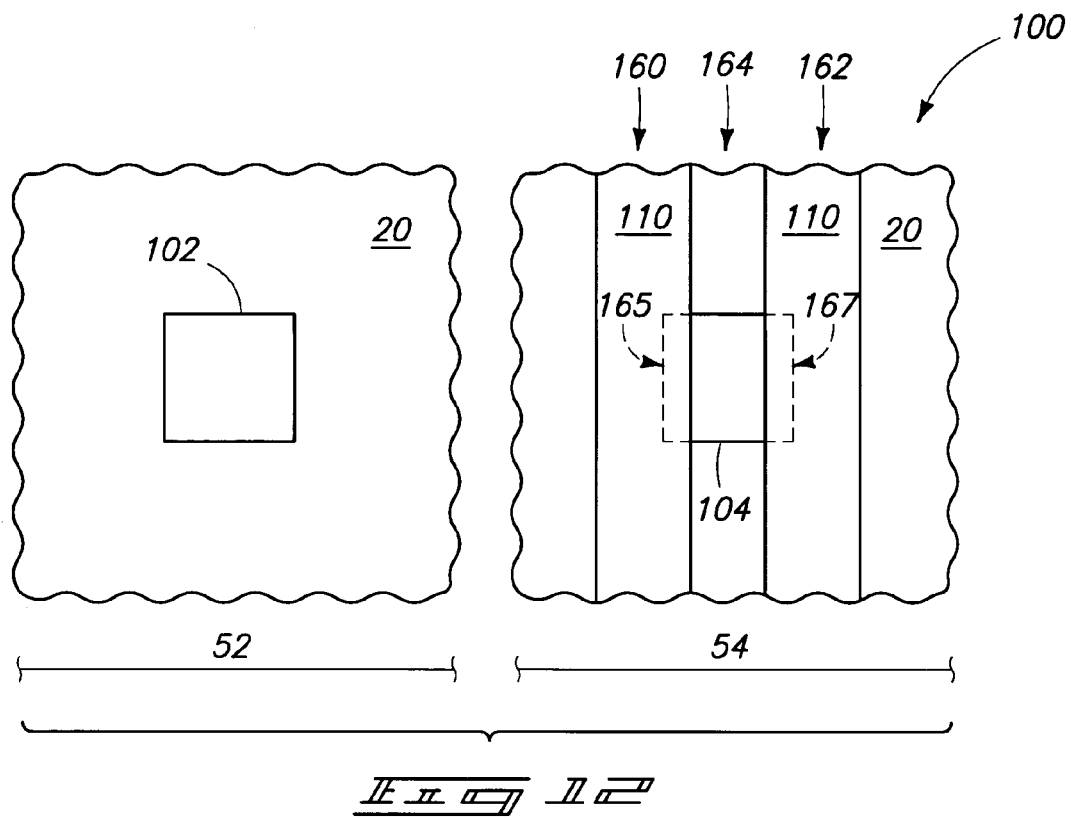
FIG. 12 is a view of the FIG. 11 fragments shown at a processing stage subsequent to that of FIG. 11 in accordance with an exemplary aspect of the invention.
Figure 13:
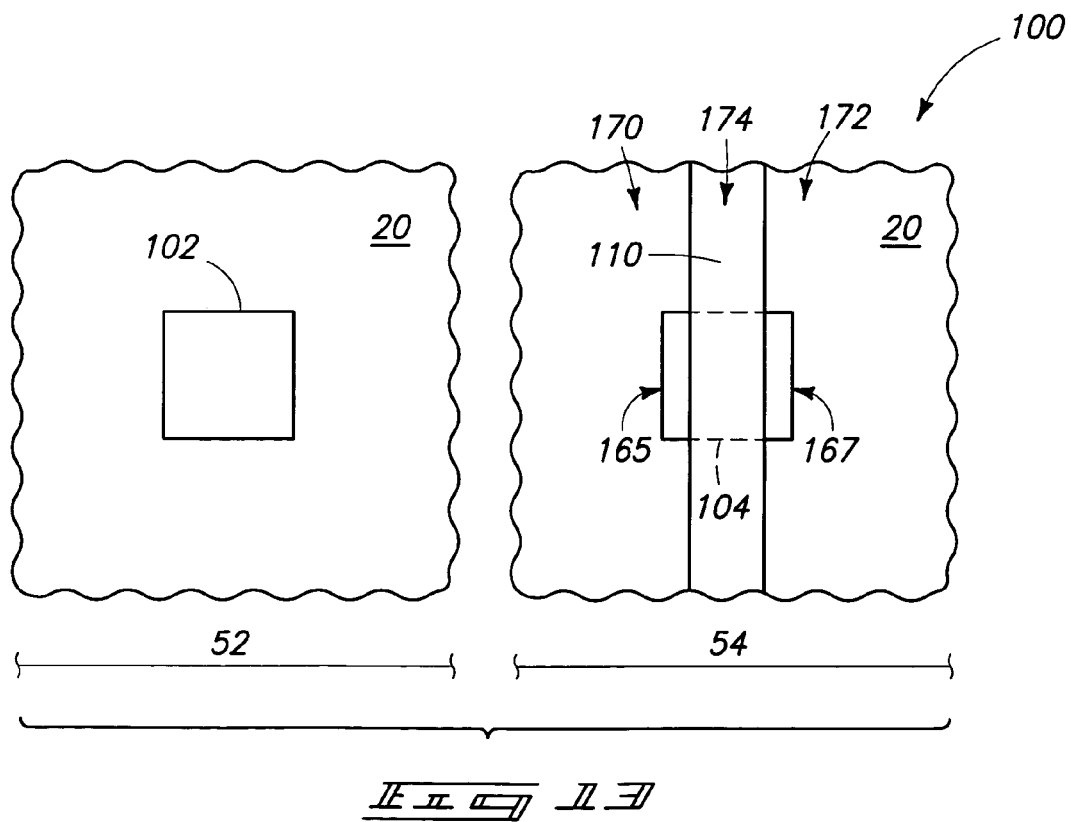
FIG. 13 is a view of the FIG. 11 fragments shown at a processing stage subsequent to that of FIG. 11 in accordance with another aspect of the invention.
Figure 14:
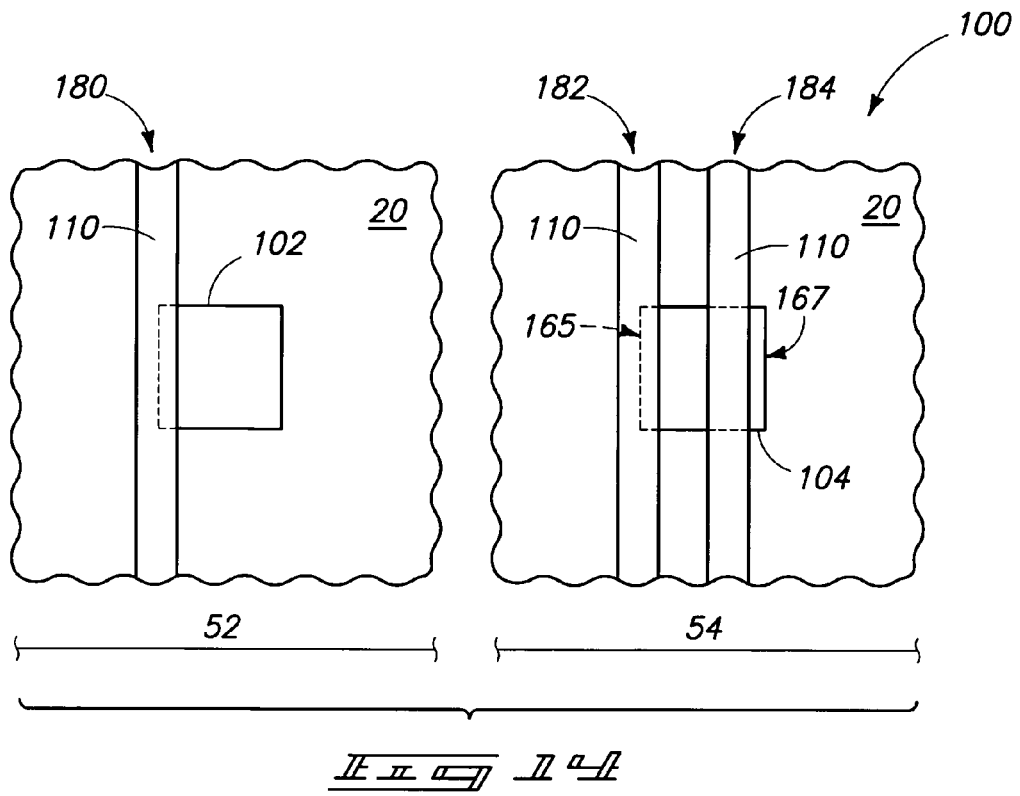
FIG. 14 is a view of the FIG. 11 fragments shown at a processing stage subsequent to that of FIG. 11 in accordance with yet another aspect of the invention.

FIGS. 12-14 illustrate exemplary masking patterns that can be utilized in aspects of the present invention.

Figure 11:
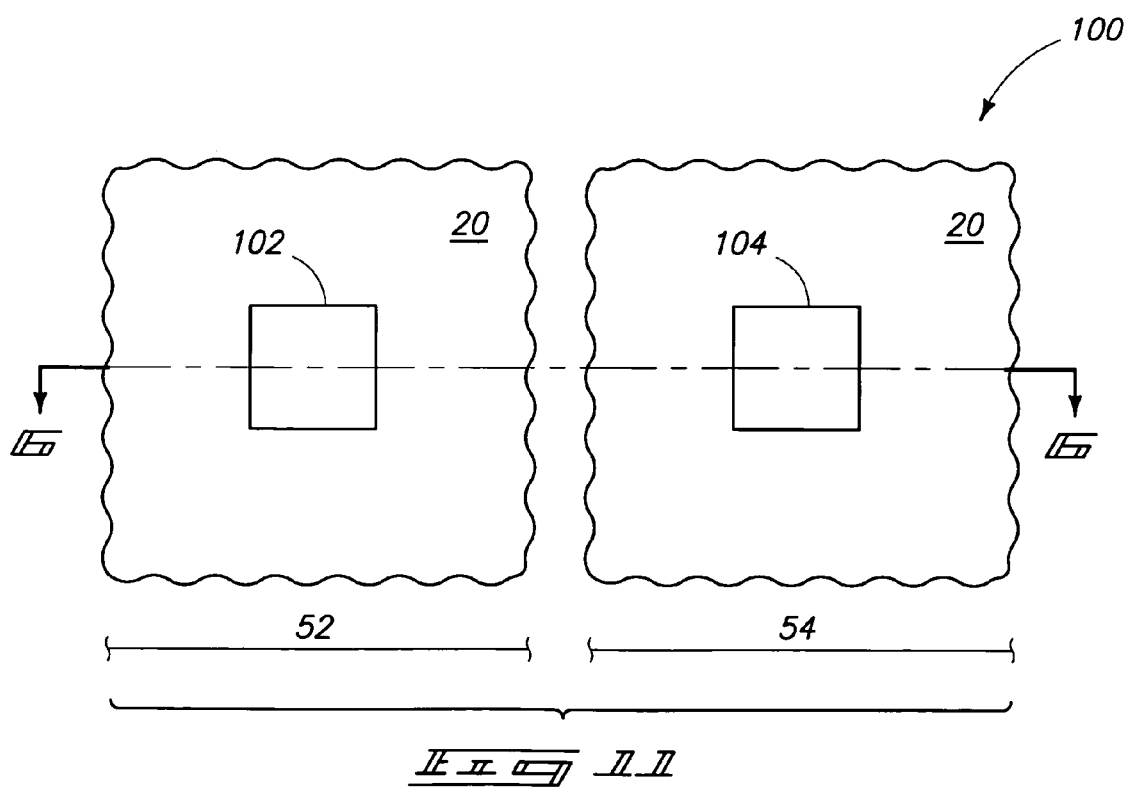
FIG. 11 is a diagrammatic, fragmentary top view of a pair of fragments of a semiconductor construction at the processing stage of FIG. 6. The cross-section of FIG. 6 is shown along the line 6-6 of FIG. 11.

Referring initially to FIG. 12, construction 100 is shown in the top view of FIG. 11, and after masking material 110 has been formed over the segment 54. The shown masking material comprises a pair of strips 160 and 162 which extend over portions of channel region location 104 while leaving a central region 164 of the channel region location 104 uncovered. The shown channel region 104 can be considered to comprise a pair of opposing edges 165 and 167, and the masking material 110 can be considered to comprise a pair of spaced apart strips 160 and 162 which are along the opposing edges 165 and 167. The covered portion of channel region location 104 is shown in dashed-line view in FIG. 12 to indicate that this portion is beneath masking material 110.

FIG. 13 illustrates another aspect of the invention in which masking material 110 is formed as a strip over a portion of second channel region location 104. The aspect of FIG. 13 is an inverse of the aspect of FIG. 12 in that the covered region of second channel region location 104 is a strip along the center of the channel region, while uncovered portions of second channel region location 104 are along the sidewall edges 165 and 167 of the location 104. More specifically, the uncovered portions of channel region location 104 can be considered to correspond to strips 170 and 172 along edges 165 and 167, respectively, and the covered portion is a strip 174 along a central region between the uncovered strips 170 and 172.

Referring next to FIG. 14, an aspect of the invention is illustrated in which masking material 110 is patterned to form a strip 180 over a portion of channel region location 102, as well as strips 182 and 184 over portions of second channel region location 104. Even though portions of both first channel region 102 and second channel region location 104 are blocked, the percentage of the area of first channel region 102 that is blocked is less than the percentage of the area of second channel region 104 that is blocked, and accordingly more dopant will be implanted into region 102 during the implant (FIG. 8) than is implanted into channel region location 104.

It is noted that the embodiments discussed above with reference to FIGS. 12 and 13 had both of the lateral edges 165 and 167 of second channel region location 104 being identical to one another in that both were either blocked or unblocked. In contrast, the embodiment of FIG. 14 has one of the edge regions blocked (specifically, edge region 165) while leaving the other unblocked (specifically, edge region 167).

Figure 15:
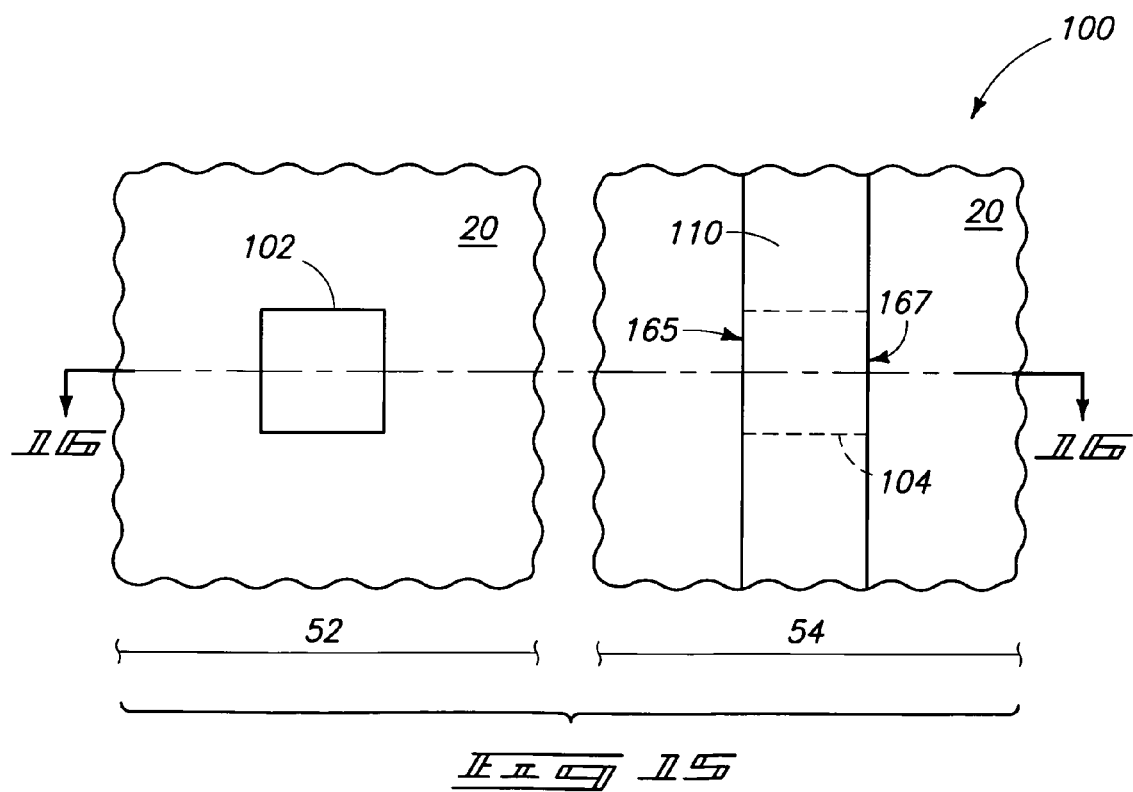
FIG. 15 is a view of the FIG. 11 fragments shown at a processing stage subsequent to that of FIG. 11 in accordance with yet another aspect of the invention.

FIG. 15 illustrates an aspect of the invention in which masking material 110 covers an entirety of second channel region location 104. Such aspect is further illustrated in a cross-sectional view of FIG. 16 in which it can be seen that the lateral periphery of masking material 110 is approximately coextensive with the lateral edges 165 and 167 of channel region location 104. In other words, masking material 110 has lateral edges 190 and 192 which are at approximately the same locations as the lateral sidewalls 165 and 167 of channel region location 104.

Figure 16:
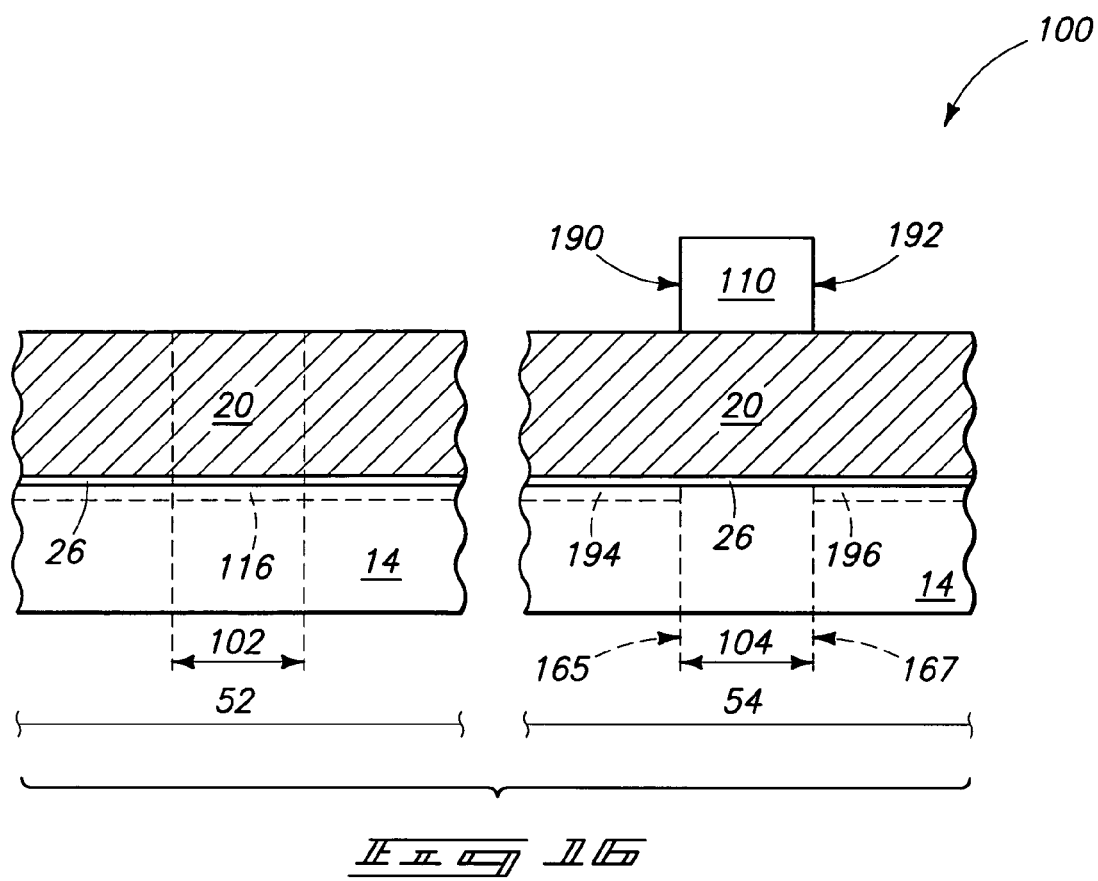
FIG. 16 is a diagrammatic, cross-sectional view along the line 16-16 of FIG. 15.

The construction of FIG. 16 is shown after the construction has been subjected to the same implant discussed above with reference to FIG. 8. The implant has formed the doped region 116 within segment 52, and has formed doped regions 194 and 196 within segment 54. The doped regions 194 and 196 are proximate the lateral peripheries of channel region location 104.

Figure 17:
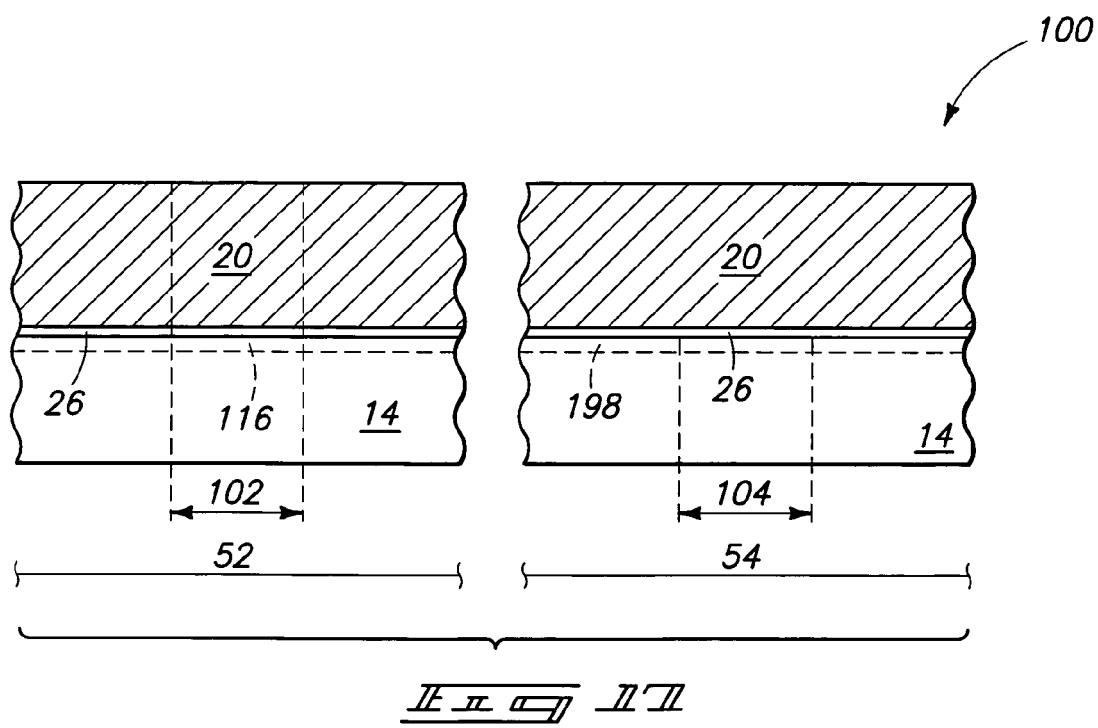
FIG. 17 is a view of the FIG. 16 wafer fragments shown at a processing stage subsequent to that of FIG. 16.

Referring next to FIG. 17, the construction 100 of FIG. 16 is illustrated after such construction has been subjected to appropriate thermal processing to diffuse the dopant from regions 194 and 196 (FIG. 16) across channel region location 114. Such forms a doped region 198 extending across the channel region location 104. The construction of FIG. 17 can subsequently be treated in accordance with methodology described above with reference to FIG. 10 to form a pair of transistor constructions analogous to constructions 132 and 134 discussed above.

The methodology of FIGS. 15-17 has advantageously formed doped regions laterally outward of a channel region location, but close enough to the channel region location that dopant can diffuse from the doped regions into the channel region location. The dopant can correspond to, for example, a threshold voltage implant dopant.

The methodology described above for forming tailored doped implants relative to multiple transistor devices can form relatively flat dopant profiles within all of the channel region locations with appropriate thermal processing. Generally, dopant diffusion throughout the substrate 14 can be very fast so that the dopant fully diffuses throughout a channel region location, even if the dopant is provided within only a small portion of the channel region location initially. Blocking a significant portion of a channel region location during an implant can significantly reduce a threshold voltage of the transistor device formed to encompass such channel region location relative to a transistor device encompassing a channel region location which was not blocked. For instance, if half of a channel region location is blocked during an implant, the threshold voltage of a transistor encompassing such channel implant region location can be about 200 millivolts different than a transistor device encompassing a channel region location which was not blocked during the implant of threshold voltage dopant.

Although the processing discussed above forms two different channel devices with an implant, it is to be understood that the processing can be readily extended to form more than two different channel devices with the same implant by providing multiple channel devices which are blocked to different extents relative one another.

The methodology described above can be utilized for forming other devices besides transistors, or in addition to transistors. For instance, FIGS. 18-22 illustrate application of the methodology to capacitor fabrication.

Figure 18:
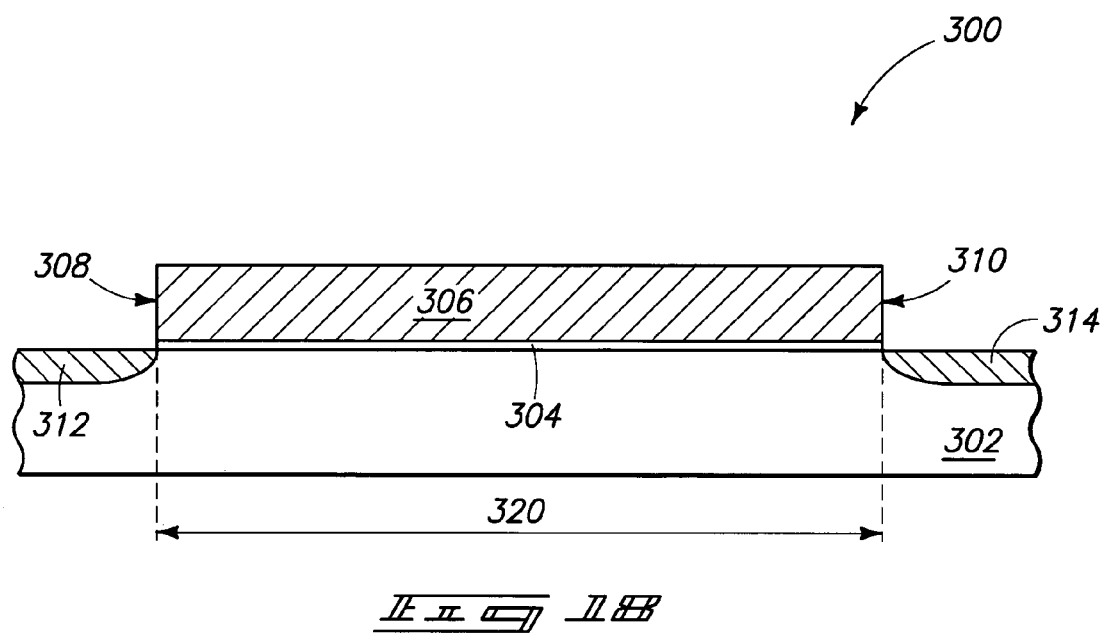
FIG. 18 is a diagrammatic, cross-sectional fragmentary view of a semiconductor construction at a preliminary processing stage of an exemplary aspect of the invention for forming a capacitor construction.

Referring to FIG. 18, a semiconductor construction 300 is illustrated at a preliminary processing stage. Semiconductor construction 300 comprises a substrate 302 which can be identical to the substrate 14 described above. Construction 300 also comprises a dielectric material 304 over substrate 302, and a conductive material 306 over the dielectric material 304. Conductive material 306 is patterned into a block comprising opposing sidewalls 308 and 310. Conductively-doped diffusion regions 312 and 314 extend into substrate 302 proximate the sidewalls 308 and 310 of material 306. Material 306 can be referred to as a first capacitor electrode, and diffusion regions 312 and 314 can together be referred to as a second capacitor electrode. A location beneath dielectric material 304 and between source/drain regions 312 and 314 corresponds to a capacitor channel region location 320. Such channel region location is ultimately to be lightly doped with conductivity-enhancing dopant. The amount of dopant provided within the channel region location 320 can impact the capacitive property of a capacitor formed to comprise the channel region location.

The substrate 302 can comprise, consist essentially of, or consist of monocrystalline silicon; the dielectric material 304 can comprise, consist essentially of, or consist of silicon dioxide and can be in direct physical contact with the substrate (as shown); and the conductive material 306 can comprise any suitable materials, including, for example, conductively-doped silicon, and/or metals, and/or metal compounds and can be in direct physical contact with the dielectric material 304 (as shown). Conductively-doped diffusion regions 312 and 314 can comprise any suitable conductivity-enhancing dopant, including, for example, one or both of n-type dopant and p-type dopant.

Figure 19:
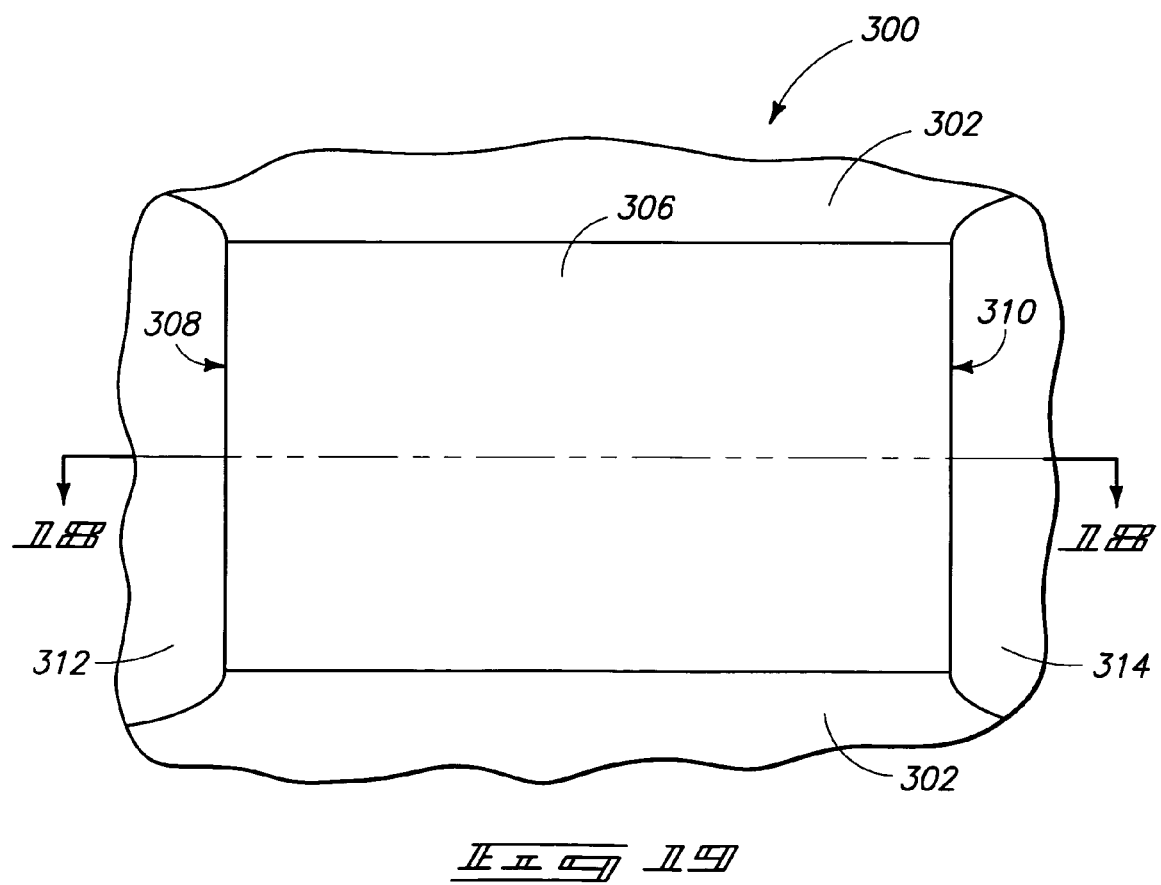
FIG. 19 is a top view of a fragment comprising the FIG. 18 cross-section, with the cross-section of FIG. 18 being along the line 18-18 of FIG. 19.

FIG. 19 shows a top view of the construction of FIG. 18, and shows electrode 306 as a plate having a rectangular shape. It is to be understood, however, that electrode 306 can comprise any suitable shape, including, for example, shapes with a circular or curved lateral periphery, in addition to shapes with polygonal lateral peripheries.

FIGS. 20 and 21 show construction 300 after formation of a patterned mask 330 over capacitor channel location 320. Mask 330 can comprise the same compositions as discussed above regarding mask 110, and accordingly can comprise, consist essentially of, or consist of photoresist. Mask 330 covers some portions of capacitor channel region location 320, while leaving other portions exposed. While the mask is in place, a dopant 332 is implanted to form doped regions 334 within capacitor channel region location 320. The amount of dopant provided within the capacitor channel region location 320 during the implant of dopant 332 can be tailored by tailoring the amount of capacitor channel region location 320 that is covered by mask 330 relative to the amount that is not covered by mask 330.

In the shown aspect of the invention, mask 330 comprises a plurality of strips which are spaced from one another, and accordingly the covered portions of capacitor channel region location 320 (which can be referred to as a first portion of the capacitor channel region location) correspond to a plurality of strips which are spaced apart by the uncovered portions of capacitor channel region location 320 (which can be referred to as a second portion of the capacitor channel region location). The shown aspect of the invention comprises four strips of masking material, but it is to be understood that the invention encompasses other aspects in which less than four strips (for example two strips or three strips) are utilized, or in which more than four strips are utilized.

Although the mask 330 is shown provided after formation of dielectric material 304 and conductive material 306, it is to be understood that the invention encompasses other aspects (not shown) in which mask 330 is formed and implant 332 conducted before formation of one or both of dielectric material 304 and conductive material 306. Further, the mask 330 can be formed and the implant of dopant 332 conducted before provision of the conductively-doped diffusion regions 312 and 314 in some aspects of the invention (not shown).

Figure 22:
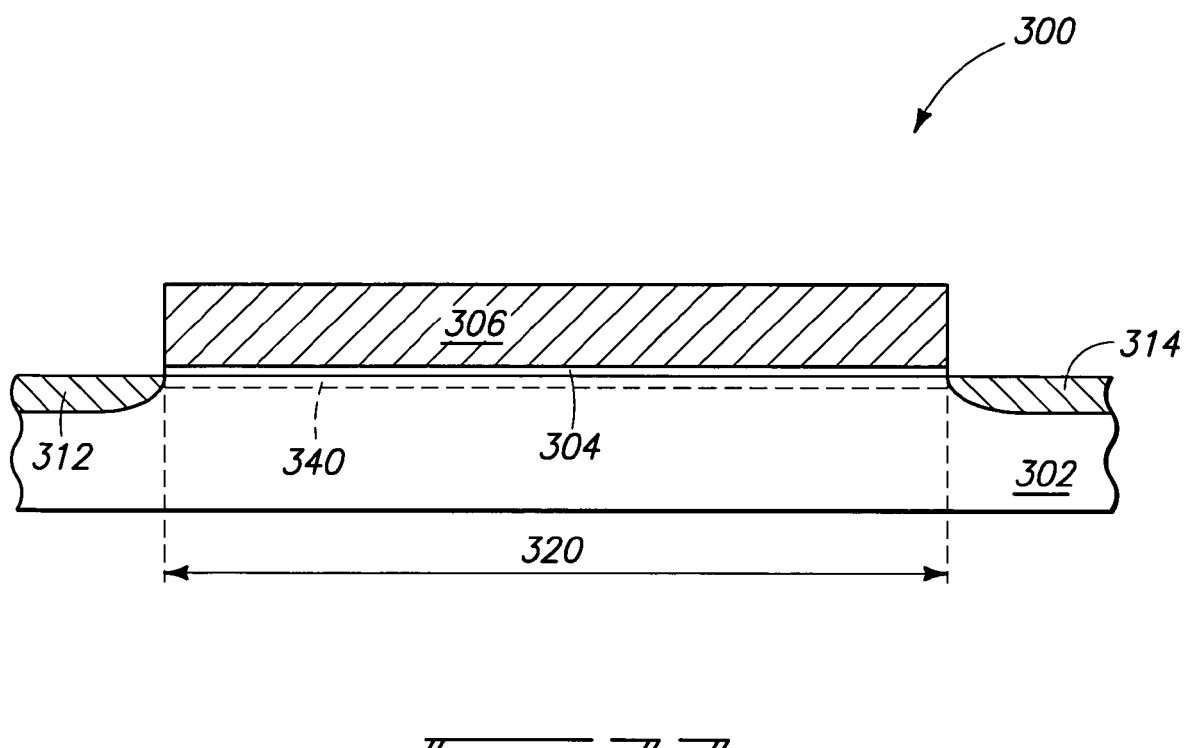
FIG. 22 is a view of the FIG. 18 cross-section shown at a processing stage subsequent to that of FIG. 20.

Referring next to FIG. 22, construction 300 is illustrated after removal of mask 330 (FIGS. 20 and 21) and after being subjected to a suitable thermal treatment so that diffusion regions 334 (FIG. 20) diffuse to form a single diffusion region 340 extending across the channel region location 320. The structure of FIG. 22 can correspond to a completed capacitor construction comprising a first electrode 306 capacitively connected to a second electrode containing source/drain regions 312 and 314.

The processing of FIGS. 18-22 can be conducted simultaneously with at least some of the processing described above with reference to FIGS. 7-17. In such aspects of the invention, the implant of FIG. 20 can be the same as the implant of FIG. 8. Accordingly, the dopant 332 of FIG. 20 can correspond to the dopant 114 of FIG. 8, and the implant utilized to provide dopant within channel region locations 102 and 104 can be the same as the implant utilized to provide dopant within capacitor channel region location 320. Thus, capacitor channel region location 320 can be doped simultaneously with the doping of channel region locations 102 and 104 in some aspects of the invention.

Utilization of a common implant for doping multiple devices can provide advantages for semiconductor fabrication, in that such can eliminate process steps which can simplify processing and reduce costs associated with the processing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming threshold voltage implant regions, comprising:
   providing a monocrystalline silicon substrate, the substrate having at least two channel region locations defined therein, one of said at least two channel region locations being a first channel region location and another of the at least two channel region locations being a second channel region location;
   providing a mask which covers a second portion of the substrate and does not cover a first portion of the substrate; an entirety of the first channel region location being within the uncovered first portion; at least some of the second channel region location being within the covered second portion, said at least some of the second channel region location being a covered section of the second channel region location;
   implanting threshold voltage dopant into the uncovered first portion of the substrate; and
   diffusing the implanted threshold voltage dopant throughout 80% or more of the area of the covered section of the second channel region location.

2. The method of claim 1 wherein the covered section of the second channel region location is less than an entirety of the second channel region location.

3. The method of claim 1 wherein the second channel region location has an area, and wherein the covered section of the second channel region location is less than an entirety of the area of the second channel region location and greater than 75% of the area of the second channel region location.

4. The method of claim 1 wherein the second channel region has an area, and wherein the covered section of the second channel region location is less than an entirety of the area of the second channel region location and greater than 50% of the area of the second channel region location.

5. The method of claim 1 wherein the second channel region location has an area, and wherein the covered section of the second channel region location is less than an entirety of the area of the second channel region location and greater than 25% of the area of the second channel region location.

6. The method of claim 1 wherein, during the implanting, the first channel region location is entirely covered by a first transistor gate and the second channel region location is entirely covered by a second transistor gate; and wherein the mask covers at least a portion of the second transistor gate.

7. The method of claim 1 further comprising prior to the implanting, providing gateline material over the monocrystalline silicon substrate, the gateline material being over the two channel region locations.

8. The method of claim 7 wherein the implanting comprises implanting the threshold voltage dopant through the gateline material into the first channel region location.

9. The method of claim 7 wherein the gateline material comprises portions of the gateline material that are over regions of the substrate that are not within the channel region locations and the method further comprises:
   implanting the dopant through the portions of the gateline material and into the regions of the substrate that are not within the channel region locations; and
   subsequent to the implanting, removing the portions of the gateline material that are over the regions of the substrate that are not within the channel region locations.

10. The method of claim 9 wherein the diffusing comprises diffusing the implanted dopant from the regions of the substrate that are not within the channel region locations into the covered section of the second channel region location.

11. The method of claim 1 further comprising after the implanting, providing a first gateline over the first channel region location and providing a second gateline over the second channel region location.

12. The method of claim 1 wherein subsequent to the diffusing, the concentration of the dopant is substantially the same throughout the second channel region location.

13. The method of claim 1 wherein during the implanting, no gateline material is present above either the first channel region location or the second channel region location.

14. A method of forming threshold voltage implant regions, comprising:
   providing a monocrystalline silicon substrate, the substrate having at least two channel region locations defined therein, one of said at least two channel region locations being a first channel region location and another of the at least two channel region locations being a second channel region location;
   providing a mask which covers a second portion of the substrate and does not cover a first portion of the substrate; an entirety of the first channel region location being within the uncovered first portion; at least some of the second channel region location being within the covered second portion, said at least some of the second channel region location being a covered section of the second channel region location;

implanting threshold voltage dopant into the uncovered first portion of the substrate;

diffusing the implanted threshold voltage dopant throughout 80% or more of the area of the covered section of the second channel region location;

providing a first gateline over the first channel region location; and providing a second gateline over the second channel region location;

wherein the covered section of the second channel region location is an entirety of the second channel region location.

15. The method of claim 14 wherein:

the mask does not cover a third portion of the substrate; and a part of the substrate laterally adjacent to a sidewall of the second channel region location and in physical contact with the sidewall of the second channel region location is within the uncovered third portion of the substrate.

16. The method of claim 15 wherein:

the implanting comprises implanting the dopant into the uncovered third portion of the substrate; and the diffusing comprises diffusing the implanted dopant from the part of the substrate laterally adjacent to the sidewall of the second channel region location into the second channel region location.

17. The method of claim 16 wherein:

the part of the substrate laterally adjacent to the sidewall of the second channel region location comprises a first part;

the sidewall comprises a first sidewall;

the second channel region location comprises a second sidewall opposite the first sidewall;

the mask does not cover a fourth portion of the substrate;

a second part of the substrate laterally adjacent to the second sidewall of the second channel region location and in physical contact with the second sidewall of the second channel region location is within the fourth uncovered portion of the substrate;

the implanting comprises implanting the dopant into the uncovered fourth portion of the substrate; and the diffusing comprises diffusing the implanted dopant from the second part of the substrate laterally adjacent to the second sidewall of the second channel region location into the second channel region location.

18. A method of forming threshold voltage implant regions, comprising:

providing a monocrystalline silicon substrate, the substrate having at least two channel region locations defined therein, one of said at least two channel region locations being a first channel region location and another of the at least two channel region locations being a second channel region location;

providing a mask which covers a second portion of the substrate and does not cover a first portion of the substrate; an entirety of the first channel region location being within the uncovered first portion; at least some of the second channel region location being within the covered second portion, said at least some of the second channel region location being a covered section of the second channel region location;

implanting threshold voltage dopant into the uncovered first portion of the substrate;

diffusing the threshold voltage dopant into the covered section of the second channel region location so that a concentration of the threshold voltage dopant in an uncovered section of the second channel region location not covered by the mask during the implanting is substantially similar to a concentration of the threshold voltage dopant in the covered section of the second channel region location; and wherein the diffusing comprises diffusing the threshold voltage dopant throughout a substantial entirety of the covered section of the second channel region location.

* * * * *